(12) United States Patent
Hiromori et al.

(10) Patent No.: US 11,217,362 B2
(45) Date of Patent: Jan. 4, 2022

(54) WIRE HARNESS

(71) Applicant: SUMITOMO WIRING SYSTEMS, LTD., Yokkaichi (JP)

(72) Inventors: Yuya Hiromori, Yokkaichi (JP); Hirokazu Nakai, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 16/981,889

(22) PCT Filed: Mar. 25, 2019

(86) PCT No.: PCT/JP2019/012415
§ 371 (c)(1),
(2) Date: Sep. 17, 2020

(87) PCT Pub. No.: WO2019/188938
PCT Pub. Date: Oct. 3, 2019

(65) Prior Publication Data
US 2021/0012924 A1 Jan. 14, 2021

(30) Foreign Application Priority Data
Mar. 30, 2018 (JP) .............................. JP2018-069921

(51) Int. Cl.
*H01R 9/05* (2006.01)
*H01B 7/00* (2006.01)
(Continued)

(52) U.S. Cl.
CPC .......... *H01B 7/0045* (2013.01); *H01B 7/188* (2013.01); *H01B 7/228* (2013.01)

(58) Field of Classification Search
CPC ........................................................ H01R 9/05
See application file for complete search history.

(56) References Cited

U.S. PATENT DOCUMENTS

| | | | | | |
|---|---|---|---|---|---|
| 3,280,242 | A | * | 10/1966 | Brown | F16D 3/62 464/66.1 |
| 4,494,520 | A | * | 1/1985 | Hurwitz | H01R 4/646 123/633 |

(Continued)

FOREIGN PATENT DOCUMENTS

| | | |
|---|---|---|
| JP | S59-161219 U | 10/1984 |
| JP | 2004-171952 A | 6/2004 |

(Continued)

OTHER PUBLICATIONS

Jul. 11, 2019 Search Report issued in International Patent Application No. PCT/JP2019/012415.

*Primary Examiner* — Chau N Nguyen
(74) *Attorney, Agent, or Firm* — Oliff PLC

(57) ABSTRACT

A wire harness, including: a plurality of wire groups that each include a plurality of wires; a plurality of tubular first flexible shields that each encase a different one wire group of the plurality of wire groups; a tube that is made of a metal and into which drawn-out portions of the wires, which are drawn out from the first flexible shields, are inserted; and a tubular second flexible shield that bunches together and encases the drawn-out portions of the wires at positions thereof that are outside of the tube, and is electrically connected to the first flexible shields and the tube.

12 Claims, 3 Drawing Sheets

(51) Int. Cl.
*H01B 7/18* (2006.01)
*H01B 7/22* (2006.01)

(56) References Cited

U.S. PATENT DOCUMENTS

| | | | | |
|---|---|---|---|---|
| 6,095,829 | A * | 8/2000 | Burland | H01R 9/0512 |
| | | | | 439/98 |
| 6,227,881 | B1 * | 5/2001 | Tharp | H01R 13/65912 |
| | | | | 439/98 |
| 6,395,977 | B1 * | 5/2002 | Yamamoto | H01R 24/44 |
| | | | | 174/36 |
| 7,041,907 | B2 * | 5/2006 | Miyazaki | H01R 13/6581 |
| | | | | 174/359 |
| 7,094,970 | B2 | 8/2006 | Kihira | |
| 7,255,602 | B1 * | 8/2007 | Driessen | H01R 13/65912 |
| | | | | 439/607.47 |
| 9,017,110 | B2 * | 4/2015 | Guillanton | H02G 3/0462 |
| | | | | 439/730 |
| 2015/0155638 | A1 * | 6/2015 | Nagahashi | H01R 4/203 |
| | | | | 174/74 R |

FOREIGN PATENT DOCUMENTS

| | | |
|---|---|---|
| JP | 2012-113949 A | 6/2012 |
| WO | 2018/056460 A1 | 3/2018 |

\* cited by examiner

WIRE HARNESS

BACKGROUND

The present disclosure relates to a wire harness that is used in a vehicle and the like.

Wire harnesses for vehicles are known (see JP 2004-171952A for example) that include a shield structure in which a plurality of wires are collectively encased in a tubular flexible shield member, and an end portion of the flexible shield member is connected to a metal tubular member (such as a shield shell).

SUMMARY

In a wire harness like the one described above, if the wires that are led out from the tubular member are branched and drawn out in pluralities of wires (wire groups), it is preferable to include a shield structure in which the branched wire groups are collectively encased by flexible shield members that each shield a wire group. In this case, end portions of the flexible shield members are connected to the outer peripheral surface of the tubular member. On the other hand, the wires are drawn out from the flexible shield members in an exposed state before being inserted into the tubular member, and are then inserted into the tubular member. For this reason, the wires are exposed from the flexible shield members and the parts of the wires that are not inside the tubular member are not shielded, and thus there is concern that electromagnetic noise may be emitted from the unshielded parts of the wires.

An exemplary aspect of the disclosure suppresses the emission of electromagnetic noise in a wire harnesses in which a plurality of wires in wire groups are collectively shielded by flexible shield members that each shield a wire group.

A wire harness according to an exemplary aspect includes: a plurality of wire groups that each include a plurality of wires; a plurality of tubular first flexible shields that each encase a different one wire group of the plurality of wire groups; a tube that is made of a metal and into which drawn-out portions of the wires, which are drawn out from the first flexible shields, are inserted; and a tubular second flexible shield that bunches together and encases the drawn-out portions of the wires at positions thereof that are outside of the tube, and is electrically connected to the first flexible shields and the tube.

With the present disclosure, it is possible to suppress the emission of electromagnetic noise in a wire harness in which a plurality of wires in wire groups are collectively shielded by flexible shields that each shield a wire group.

DETAILED DESCRIPTION OF EMBODIMENTS

Figure 1:
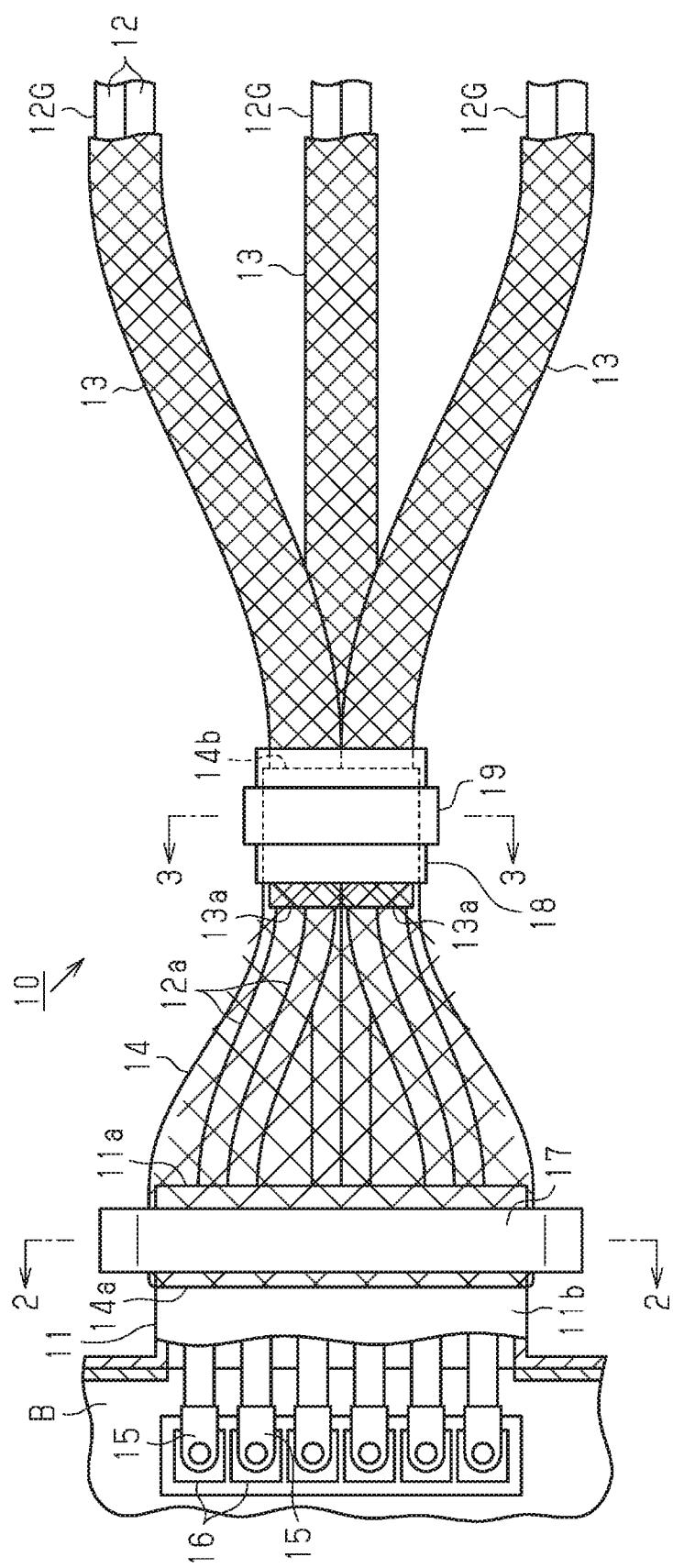
FIG. 1 is a plan view of a wire harness of an embodiment.

The following is a description of an embodiment of a wire harness. Note that, for convenience of description, portions of the configuration may be shown in an exaggerated or simplified manner in the drawings. Also, the dimension ratios of the portions may be different from the actual ratios thereof.

As shown in FIG. 1, a wire harness 10 of the present embodiment includes a metal tubular member 11 (metal tubes), six wires 12 that are inserted into the tubular member 11, three tubular first flexible shield members 13 (first flexible shields), and one tubular second flexible shield member 14 (second flexible shield).

The wires 12 are constituted by non-shielded type coated wires that do not include their own shield structures. Two of the wires 12 constitute one wire group 12G. In other words, in the present embodiment, there are three of the wire groups 12G each constituted by two of the wires 12.

The tubular member 11 of the present embodiment may be, for example, a shield shell that is attached to a battery B of a vehicle, and may be provided on an end portion of the wire harness 10 in the lengthwise direction thereof. The tubular member 11 functions to shield the portions of the wires 12 that connect to the battery B.

The wires 12 are inserted into the tubular member 11 and extend towards the battery B, and the end portions of the wires 12 in the battery B are provided with terminals 15 that are respectively connected to terminals 16 of the battery B. The wires 12 that are led out from the tubular member 11 are branched into three wire groups 12G, and each of the wire groups 12G are drawn out and are individually connected to a respective device (not shown).

The first flexible shield members 13 are formed from a metal material into a tubular shape. The first flexible shield members 13 collectively encase the wire groups 12G that are led out from the tubular member 11, and function to block electromagnetic noise that is emitted from the wires 12. Also, the first flexible shield members 13 have configurations that excel in flexibility to easily allow the wire groups 12G to be routed. The first flexible shield members 13 of the present embodiment may be tubular braided members, for example, that are obtained by braiding a plurality of metal wires together into a mesh shape.

The second flexible shield member 14 is formed from a metal material into a tubular shape. The second flexible shield member 14 of the present embodiment may be a tubular braided member, for example, that is obtained by braiding a plurality of metal wires together into a mesh shape. The second flexible shield member 14 is electrically connected to the tubular member 11 and the first flexible shield members 13.

A first end portion 14a (first end) of the second flexible shield member 14 in the axial direction thereof (the lengthwise direction of the wire harness 10) is coupled to an open end portion 11a (the end portion on the side opposite to the battery B) from which the wires 12 in the tubular member 11 are led out. The wire groups 12G and the first flexible shield members 13 are inserted into the second flexible shield member 14.

Figure 2:
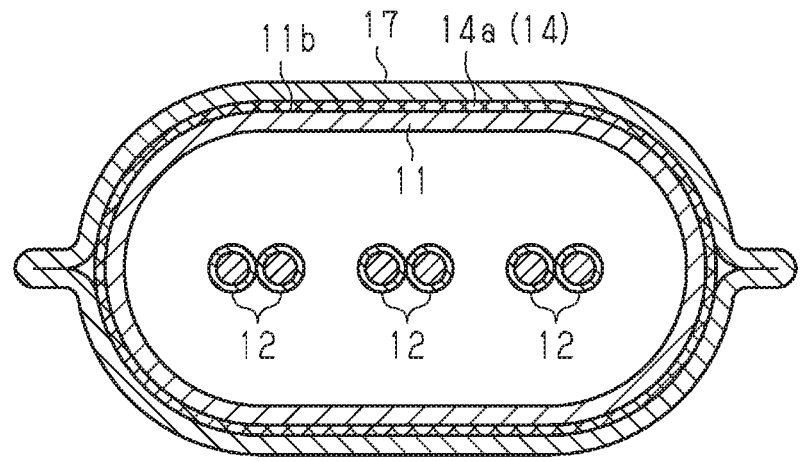
FIG. 2 is an end view taken at line 2-2 in FIG. 1.

As shown in FIG. 2, the first end portion 14a of the second flexible shield member 14 is externally fitted over the tubular member 11 so as to encase the entire circumference thereof, and is coupled to an outer peripheral surface 11b of the tubular member 11 by a caulking ring 17 that is provided on an outer peripheral surface side of the first end portion 14a. The caulking ring 17 is fitted onto the tubular member 11 in a mode in which the first end portion 14a of the second flexible shield member 14 is sandwiched between the caulking ring 17 and the outer peripheral surface 11b of the tubular member 11. Also, the first end portion 14a is pressed against the outer peripheral surface 11b of the tubular member 11 by being caulked by the caulking ring 17. Thus, electrical conduction between the second flexible shield member 14 and the tubular member 11 is stably maintained.

Figure 3:
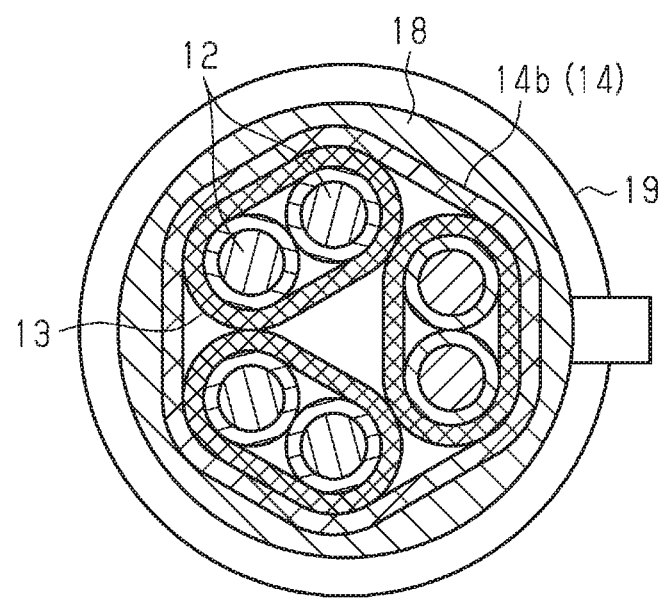
FIG. 3 is an end view taken at line 3-3 in FIG. 1.

As shown in FIG. 1 and FIG. 3, a second end portion 14b (second end), which is on the side of the second flexible shield member 14 that is opposite to the first end portion 14a, is coupled to the first flexible shield members 13 in a mode in which the second end portion 14b bunches together and encases the first flexible shield members 13. More specifically, the second end portion 14b of the second flexible shield member 14 is externally fitted in a state of bunching together open end portions 13a of the first flexible shield members 13 (the end portions thereof in the lengthwise direction) and the wires 12 in the first flexible shield members 13 so as to encase the periphery of the bunched wires and shield members. Also, the second flexible shield member 14 and the first flexible shield members 13 are coupled to each other by being bound in an adhesive tape 18, and by a metal band 19 serving as a fastening member (fastener) that is mounted over the taping.

The adhesive tape 18 is wound around an area straddling the second end portion 14b of the second flexible shield member 14 and the first flexible shield members 13. Thus, the second flexible shield member 14 and the first flexible shield members 13 are fixed to each other such that displacement thereof does not occur in the lengthwise direction of the wire harness 10.

The metal band 19 is mounted around the outer periphery of the adhesive tape 18 at a portion at which the second flexible shield member 14 and the first flexible shield members 13 overlap with each other. Also, the adhesive tape 18, the second end portion 14b of the second flexible shield member 14, the first flexible shield members 13, and the wires 12 in the first flexible shield members 13 are fixed in a compressed state due to being fastened by the metal band 19 from the outer peripheral side of the adhesive tape 18. In this state, the first flexible shield members 13 and the second end portion 14b of the second flexible shield member 14 are sandwiched by the wires 12 and the metal band 19. Thus, electrical conduction between the first flexible shield members 13 and the second flexible shield member 14 is stably maintained. Note that the cross-sectional shape of the coupled portions of the second flexible shield member 14 and the first flexible shield members 13 is substantially round due to the fastening of the metal band 19.

As shown in FIG. 1, the open end portions 13a of the first flexible shield members 13 and drawn-out portions 12a of the wires 12 that are drawn out from the open end portions 13a are inserted into the second flexible shield member 14. Also, the drawn-out portions 12a of the wires 12 are inserted into the tubular member 11 and extend towards the battery B.

The following describes the actions of the present embodiment.

The second flexible shield member 14 bunches together and encases the wires 12 (the drawn-out portions 12a) immediately after being led out from the open end portion 11a of the tubular member 11, and thus electromagnetic noise emitted from the wires 12 in the relevant locations is blocked. Also, the first flexible shield members 13 encase the wire groups 12G that are branched and drawn out, thus blocking electromagnetic noise that is emitted from the wire groups 12G.

The following describes the effects of the present embodiment.

(1) The drawn-out portions 12a of the wires 12 that are drawn out from the first flexible shield members 13 and are inserted into the tubular member 11 are bunched together, encased, and shielded by the second flexible shield member 14. Thus, it is possible to suppress the emission of electromagnetic noise while also having a configuration in which the plurality of the wires 12 in the wire groups 12G are collectively shielded by the first flexible shield members 13 that each shield one of the wire groups 12G.

(2) The first end portion 14a of the second flexible shield member 14 in the axial direction thereof is coupled to the tubular member 11 in a mode in which the first end portion 14a encases the entire circumference of the tubular member 11. On the other hand, the second end portion 14b, which is on the side of the second flexible shield member 14 that is opposite to the first end portion 14a, is coupled to the first flexible shield members 13 in a mode in which the second end portion 14b bunches together and encases the first flexible shield members 13. With this configuration, it is possible for the second flexible shield member 14 to be electrically connected to the first flexible shield members 13 and the tubular member 11, while also bunching together and encasing the drawn-out portions 12a of the wires 12 in the second flexible shield member 14.

(3) The wire harness 10 includes the adhesive tape 18 that is flexible and is wound around an area straddling the second end portion 14b of the second flexible shield member 14 and the first flexible shield members 13. Thus, it is possible to fix the first flexible shield members 13 and the second flexible shield member 14 to each other with use of the adhesive tape 18.

(4) The wire harness 10 includes the metal band 19 that fastens, from the outer peripheral side, the second end portion 14b of the second flexible shield member 14 that bunches together and encases the first flexible shield members 13, and the first flexible shield members 13 and the second flexible shield member 14 are sandwiched by the wires 12 and the metal band 19. With this configuration, the first flexible shield members 13 and the second flexible shield member 14 are sandwiched between the wires 12 and the metal band 19 by the fastening force of the metal band 19, and therefore it is possible to firmly couple the first flexible shield members 13 and the second flexible shield member 14. Also, the first flexible shield members 13 and the second flexible shield member 14 are pressed against each other by the fastening force of the metal band 19, and therefore it is possible to suitably maintain electrical conduction between the first flexible shield members 13 and the second flexible shield member 14.

(5) The metal band 19 is mounted to the outer peripheral side of the adhesive tape 18. That is to say that the adhesive tape 18 is interposed between the metal band 19 and the second flexible shield member 14. For this reason, the shape of the adhesive tape 18 changes due to the fastening force of the metal band 19, and the fastening force of the metal band 19 is evenly applied to the second flexible shield member 14 in the circumferential direction thereof. Thus, it is possible to more suitably maintain electrical conduction between the first flexible shield members 13 and the second flexible shield member 14.

(6) The open end portions 13a from which the drawn-out portions 12a are drawn out from the first flexible shield members 13 are positioned in the second flexible shield member 14 in a state of not being directly coupled with the tubular member 11. With this configuration, there is no need to directly couple the first flexible shield members 13 to the tubular member 11, which can contribute to improving the assemblability of the wire harness 10.

The present embodiment can also be changed and implemented in the following ways. The present embodiment and the variations thereof described below can be combined and implemented provided no technical inconsistencies arise therefrom.

Figure 4:
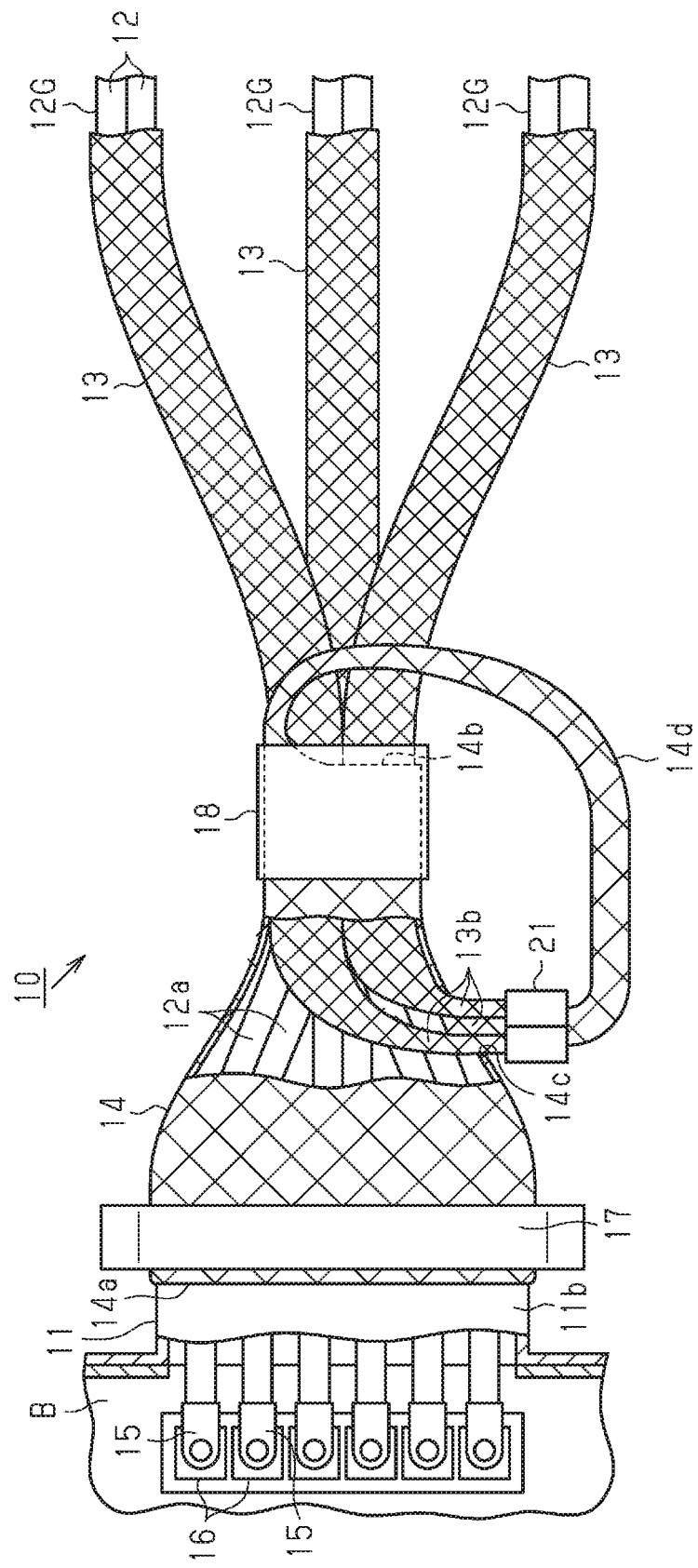
FIG. 4 is a schematic diagram of the wire harness of a variation.

With a configuration such as that shown in FIG. 4, electrical conduction between the first flexible shield members 13 and the second flexible shield member 14 may also be maintained. Note that, in FIG. 4, the second flexible shield member 14 is shown to be partially broken out. With the configuration shown in FIG. 4, the first flexible shield members 13 include first extension portions 13b (first extensions) that extend from the end portion from which the drawn-out portions 12a of the wires 12 are drawn out (refer to the open end portions 13a in the embodiment described above). The first extension portions 13b are formed by bunching the metal wires that constitute the first flexible shield members 13. The first extension portions 13b are drawn out through a lead-out hole 14c, which is formed in the second flexible shield member 14, to the outside of the second flexible shield member 14. Also, the second flexible shield member 14 includes a second extension portion 14d (second extension) that extends from the second end portion 14b. The second extension portion 14d is formed by bunching the metal wires that constitute the second flexible shield member 14. Thus, the first extension portions 13b and the second extension portion 14d are coupled to each other by a coupling member 21. Note that, examples of a mode in which the first extension portions 13b and the second extension portion 14d are coupled to each other include a configuration in which the first extension portions 13b and the second extension portion 14d are crimped to each other with the coupling member 21 serving as a splice terminal (crimping terminal), or are connected to each other through resistance welding or soldering.

With this configuration, the first extension portions 13b that extend from the first flexible shield members 13 and the second extension portion 14d that is drawn out from the second flexible shield member 14 can be coupled to each other outside of the second flexible shield member 14. Thus, it is possible to improve the degree of freedom in selecting a means for connecting the first and second flexible shield members 13 and 14 to each other, and improve the reliability of the electrical connection thereof. Note that in the configuration shown in FIG. 4, the metal band 19 is not mounted on the outer periphery of the adhesive tape 18, but there is no limitation thereto, and the metal band 19 may be mounted as in the embodiment described above.

In the embodiment described above, the metal band 19 is used as the fastening member that fastens the second end portion 14b of the second flexible shield member 14 from the outside thereof, but there is no limitation thereto, and, for example, a resin band or a clinch ring may also be used instead of the metal band 19. Also, in the embodiment described above, configurations are also possible in which the metal band 19 is omitted.

In the embodiment described above, the adhesive tape 18 may also be omitted, and the metal band 19 may be mounted directly onto the outer periphery of the second flexible shield member 14.

In the embodiment described above, the open end portions 13a of the first flexible shield members 13 are not directly coupled to the tubular member 11, but there is no limitations thereto and the open end portions 13a may also be directly coupled to the tubular member 11. For example, extension portions, which extend from the open end portions 13a of the first flexible shield members 13, may also extend to the outer peripheral surface 11b of the tubular member 11, and the extension portions may be fixed to the first end portion 14a of the second flexible shield member 14 by the caulking ring 17.

In the embodiment described above, a configuration is also possible in which sleeves that are externally fitted to the wires 12 (the wire groups 12G) are positioned inside the open end portions 13a of the first flexible shield members 13 and the first and second flexible shield members 13 and 14 are sandwiched by the sleeves and the metal band 19. With this configuration, it is possible to more suitably maintain electrical conduction between the first and second flexible shield members 13 and 14.

In the embodiment described above, the caulking ring 17 is used as the coupling member for coupling the first end portion 14a of the second flexible shield member 14 to the tubular member 11. For example, a metal band or an adhesive tape may also be used instead of the caulking ring 17.

The number of wire groups 12G and first flexible shield members 13 that encase the wire groups 12G in the embodiment described above is an example, and the number thereof can be suitably changed to two, or to four or more, in accordance with the specifications of the vehicle.

The number of wires 12 included in the wire groups 12G in the embodiment described above is an example, and the number thereof can be suitably changed to three or more in accordance with the specification of the vehicle.

In the embodiment described above, a braided member is used as the first flexible shield members 13 and the second flexible shield member 14, but there is no limitation thereto. A shield member that has flexibility is sufficient as the first and second flexible shield members 13 and 14, and a metal foil may also be used instead of the braided member, for example.

In the embodiment described above, an example configuration is described in which the wire groups 12G are branched and drawn out from the tubular member 11, which acts as a shield shell that is provided on an end portion of the wire harness 10 in the lengthwise direction thereof, and is attached to the battery B. However, there is no particular limitation to this and configurations are also possible in which, for example, the wires 12 are inserted into a metal shield pipe (a tubular member) that is provided in an intermediate portion of the wire harness 10 in the lengthwise direction thereof, and the wire groups 12G are branched and drawn out from an open end portion of the shield pipe.

It will be apparent to those skilled in the art that the disclosure may be embodied in other specific forms without departing from the technical idea thereof. For example, some of the components described in the embodiment (or one or more modes thereof) may be omitted or some components may be combined. The scope of the disclosure should be determined with reference to the appended claims, along with the full scope of equivalents to which such claims are entitled.

The invention claimed is:

1. A wire harness, comprising:
a plurality of wire groups that each include a plurality of wires;

a plurality of tubular first flexible shields that each encase a different one wire group of the plurality of wire groups;
a tube that is made of a metal and into which drawn-out portions of the wires, which are drawn out from the first flexible shields in an exposed state, are inserted,
wherein in the exposed state, the wires are exposed from the first flexible shields, and the drawn-out portions that are not inside the tube are not shielded by the first flexible shields; and
a tubular second flexible shield that bunches together and encases the drawn-out portions of the wires at positions thereof that are outside of the tube, and is electrically connected to the first flexible shields and the tube, wherein
a first end of the second flexible shield in an axial direction of the second flexible shield is coupled to the tube in a mode of encasing an entire circumference of the tube,
a second end, which is on a side of the second flexible shield that is opposite to the first end, is coupled to the first flexible shields, in a mode of bunching together and encasing the first flexible shields,
the first flexible shields include first extensions that extend from ends of the first flexible shields, from which the drawn-out portions are drawn out, and are drawn out to an outside of the second flexible shield through a lead-out hole that is formed in the second flexible shield,
the second flexible shield includes a second extension that extends from the second end, and
the first extensions and the second extension are coupled to each other outside of the second flexible shield.

2. The wire harness according to claim 1, comprising an adhesive tape that has flexibility and is wound around an area straddling the second end of the second flexible shield and the first flexible shields.

3. The wire harness according to claim 2, wherein:
a fastener that fastens the second end of the second flexible shield, which bunches together and encases the first flexible shields, from an outer peripheral side of the first flexible shields, and
the fastener is mounted to an outer peripheral side of the adhesive tape.

4. The wire harness according to claim 1, comprising a fastener that fastens the second end of the second flexible shield, which bunches together and encases the first flexible shields, from an outer peripheral side of the first flexible shields.

5. The wire harness according to claim 4, wherein the first flexible shields and the second flexible shield are sandwiched by the wires and the fastener.

6. The wire harness according to claim 1, wherein ends of the first flexible shields, from which the drawn-out portions are drawn out, are positioned in the second flexible shield in a state of not being directly coupled to the tube.

7. A wire harness, comprising:
a plurality of wire groups that each include a plurality of wires;
a plurality of tubular first flexible shields that each encase a different one wire group of the plurality of wire groups;
a tube that is made of a metal and into which drawn-out portions of the wires, which are drawn out from the first flexible shields, are inserted; and
a tubular second flexible shield that bunches together and encases the drawn-out portions of the wires at positions thereof that are outside of the tube, and is electrically connected to the first flexible shields and the tube, wherein
a first end of the second flexible shield in an axial direction of the second flexible shield is coupled to the tube in a mode of encasing an entire circumference of the tube,
a second end, which is on a side of the second flexible shield that is opposite to the first end, is coupled to the first flexible shields, in a mode of bunching together and encasing the first flexible shields,
the first flexible shields include first extensions that extend from ends of the first flexible shields, from which the drawn-out portions are drawn out, and are drawn out to an outside of the second flexible shield through a lead-out hole that is formed in the second flexible shield,
the second flexible shield includes a second extension that extends from the second end, and
the first extensions and the second extension are coupled to each other outside of the second flexible shield.

8. The wire harness according to claim 7, comprising an adhesive tape that has flexibility and is wound around an area straddling the second end of the second flexible shield and the first flexible shields.

9. The wire harness according to claim 8, wherein:
a fastener that fastens the second end of the second flexible shield, which bunches together and encases the first flexible shields, from an outer peripheral side of the first flexible shields, and
the fastener is mounted to an outer peripheral side of the adhesive tape.

10. The wire harness according to claim 7, comprising a fastener that fastens the second end of the second flexible shield, which bunches together and encases the first flexible shields, from an outer peripheral side of the first flexible shields.

11. The wire harness according to claim 10, wherein the first flexible shields and the second flexible shield are sandwiched by the wires and the fastener.

12. The wire harness according to claim 7, wherein ends of the first flexible shields, from which the drawn-out portions are drawn out, are positioned in the second flexible shield in a state of not being directly coupled to the tube.

* * * * *